(12) United States Patent
Huang et al.

(10) Patent No.: US 10,353,235 B2
(45) Date of Patent: Jul. 16, 2019

(54) DISPLAY SCREEN AND ELECTRONIC DEVICE

(71) Applicant: Wuhan China Star Optoelectronics Technology Co., Ltd., Wuhan (CN)

(72) Inventors: Yaoli Huang, Wuhan (CN); Hongsen Zhang, Wuhan (CN)

(73) Assignee: WUHAN CHINA STAR OPTOELECTRONICS CO., LTD., Wuhan, Hubei (CN)

( * ) Notice: Subject to any disclaimer, the term of this patent is extended or adjusted under 35 U.S.C. 154(b) by 113 days.

(21) Appl. No.: 15/511,017

(22) PCT Filed: Feb. 17, 2017

(86) PCT No.: PCT/CN2017/073883
§ 371 (c)(1),
(2) Date: Mar. 14, 2017

(87) PCT Pub. No.: WO2018/126515
PCT Pub. Date: Jul. 12, 2018

(65) Prior Publication Data
US 2018/0299725 A1 Oct. 18, 2018

(30) Foreign Application Priority Data
Jan. 6, 2017 (CN) .......................... 2017 1 0010614

(51) Int. Cl.
*G02F 1/1335* (2006.01)
*G06K 9/00* (2006.01)
(Continued)

(52) U.S. Cl.
CPC ..... *G02F 1/133514* (2013.01); *G06K 9/0002* (2013.01); *G06K 9/0004* (2013.01);
(Continued)

(58) Field of Classification Search
None
See application file for complete search history.

(56) References Cited

U.S. PATENT DOCUMENTS 7,830,461 B2 * 11/2010 Abileah ................. G06F 3/042
349/12
9,921,677 B1 * 3/2018 Chen ................. G02F 1/133345
(Continued)

*Primary Examiner* — James A Dudek
(74) *Attorney, Agent, or Firm* — Leong C. Lei

(57) ABSTRACT

The invention provides a display screen and an electronic device, by disposing a plurality of one or more fingerprint recognition blocks (5) in the active area (AA), with pixel electrode layer (11) corresponding to each sub-pixel unit (SP) comprising a sub-pixel electrode (111) and a fingerprint recognition electrode (112) spaced from the sub-pixel electrode (111), the corresponding BM layer (21) comprising a black frame (211) covering the sub-pixel electrode (111) peripheral and a black block (212) covering the fingerprint recognition electrode (112); and disposing the fingerprint recognition signal lines (13) contacting the fingerprint recognition electrode (112) to electrically connect the fingerprint recognition electrode (112) to an integrated chip (9) of display and fingerprinting recognition. The invention is capable of integrating a fingerprint recognition function in a display area having a low resolution and without a touch function, enabling full-screen multi-block fingerprint recognition without time-division scanning.

13 Claims, 6 Drawing Sheets

(51) Int. Cl.
*H01L 27/12* (2006.01)
*G06K 9/22* (2006.01)
*G02F 1/1343* (2006.01)

(52) U.S. Cl.
CPC ............ *G06K 9/22* (2013.01); *H01L 27/1214* (2013.01); *G02F 1/1343* (2013.01); *G02F 1/133512* (2013.01)

(56) References Cited

U.S. PATENT DOCUMENTS

| | | | | |
|---|---|---|---|---|
| 2003/0183019 | A1* | 10/2003 | Chae | G06K 9/0004 73/862.624 |
| 2012/0313913 | A1* | 12/2012 | Shiraki | G06F 3/0412 345/207 |
| 2017/0242533 | A1* | 8/2017 | Liu | G06K 9/00013 |
| 2018/0076256 | A1* | 3/2018 | Jiang | G02F 1/13318 |

\* cited by examiner

DISPLAY SCREEN AND ELECTRONIC DEVICE

BACKGROUND OF THE INVENTION

1. Field of the Invention

The present invention relates to the field of fingerprint recognition techniques, and in particular to a display screen and electronic device.

2. The Related Arts

The use of fingerprint recognition technology as a biometric recognition technology provides the features of universality, uniqueness, security, collectability, acceptability and so on. Fingerprint recognition is based on the fact that different fingerprints have different texture characteristics, and by comparing a plurality of global and detailed features between different fingerprint images, is able to determine the identity of an individual the fingerprint image belongs to. The majority of the fingerprint recognition technology does not directly store the fingerprint images, but use a digital fingerprint recognition algorithm to find the characteristics of compared fingerprints. According to the different ways of fingerprint collection, fingerprint recognition technologies are divided into optical, capacitive and ultrasonic categories. As the most mature and inexpensive recognition technology in the current biometrics, fingerprint recognition is not only widely used in access control and attendance system, but also consumer electronics with the technological development. For example, many smart phones and tablet computers are also equipped with the fingerprint recognition function.

The traditional optical fingerprint recognition technology is to place the finger under a built-in light source, then using a prism to project the image to the charge coupled device (CCD) to form a grayscale image of interleaved black-and-white ridges and valleys, which can be processed by fingerprint device algorithm. However, this is not suitable for many daily applications due to large optical path and equipment size. As the smart watch and wearable devices becoming popular, the capacitive fingerprint recognition technology gains attention because of the size. The capacitive fingerprint recognition technology is to use the finger as an electrode of the capacitor and the fingerprint sensor as the other electrode to form a grayscale image based on the capacitance difference between the ridge and valley with respect to the smooth fingerprint sensor, and then uses the fingerprint algorithm to match the global and local detailed characteristics of the fingerprints to achieve fingerprint recognition.

With the popularity of smart phones and other consumer electronics, fingerprint recognition function is located gradually from the display screen exterior the display screen interior. That is, the conventional design to placing the fingerprint function at the bottom, side or back of the phone is changed to the integration into the display area of the screen. For small-to-medium size electronic devices with high resolution, such as, smart phone and tablet, a common approach is to use in-plane switching (IPS) technology to add the fingerprint recognition function to the in-cell touch panel to use touch sensor with fingerprint recognition and display time-sharing scanning to achieve integrating the fingerprint recognition into the display area (i.e., touch, display, fingerprint recognition function integrated into one). However, for display products with low resolution and without embedded touch function, such as, a small-sized visual fingerprint reader, a home TV with a fingerprint recognition function, a car display screen, etc., the same method cannot be used to integrate fingerprint recognition into display area.

SUMMARY OF THE INVENTION

The object of the present invention is to provide a display screen, capable of integrating a fingerprint recognition function in a display area having a low resolution and without a touch function, enabling full-screen multi-block fingerprint recognition without time-division scanning, improving fingerprint recognition precision and widening diversity of fingerprint recognition applications, and improving the cost-performance value of traditional display products as well as enhancing the user's experience.

Another object of the present invention is to provide an electronic device, with a display screen capable of integrating a fingerprint recognition function in a display area having a low resolution and without a touch function, enabling full-screen multi-block fingerprint recognition without time-division scanning, improving fingerprint recognition precision and widening diversity of fingerprint recognition applications, and improving the cost-performance value of traditional display products as well as enhancing the user's experience.

To achieve the above object, the present invention provides a display screen, which comprises: a thin film transistor (TFT) array substrate, a color filter (CF) substrate disposed opposite to the TFT array substrate, and a liquid crystal (LC) layer sandwiched between the TFT array substrate and the CF substrate; the TFT array substrate comprising: a pixel electrode layer and a plurality of fingerprint recognition signal lines, an interlayer insulation layer being disposed between the pixel electrode layer and the plurality of fingerprint recognition signal lines; the CF substrate comprising a black matrix (BM) layer;

the display screen comprising: an active area, and the active area comprising a plurality of pixel units, with each pixel unit comprising a plurality of sub-pixel units; one or more fingerprint recognition blocks being disposed in the active area;

in the fingerprint recognition area: the pixel electrode layer corresponding to each sub-pixel unit comprising a sub-pixel electrode and a fingerprint recognition electrode spaced from the sub-pixel electrode; the BM layer corresponding to each sub-pixel unit comprising a black frame covering the peripheral of the sub-pixel electrode and a black block covering the fingerprint recognition electrode; the fingerprint recognition signal line contacting the fingerprint recognition electrode to electrically connect the fingerprint recognition electrode to an integrated chip of display and fingerprinting recognition.

According to a preferred embodiment of the present invention, the fingerprint signal line passes a through hole penetrating the interlayer insulation layer to contact the fingerprint recognition electrode to electrically connect the fingerprint recognition electrode to an integrated chip of display and fingerprinting recognition.

According to a preferred embodiment of the present invention, the fingerprint recognition signal line is made of a metal material.

According to a preferred embodiment of the present invention, the pixel electrode layer is made of indium tin oxide (ITO).

According to a preferred embodiment of the present invention, the fingerprint recognition block has a rectangular shape, with the edge length of 4 mm-5.5 mm.

According to a preferred embodiment of the present invention, outside of the fingerprint recognition block: the pixel electrode layer corresponding to each sub-pixel unit comprises a sub-pixel electrode; and the BM layer corresponding to each sub-pixel unit comprises only the black frame covering the sub-pixel electrode peripheral.

According to a preferred embodiment of the present invention, the sub-pixel unit is a red sub-pixel unit, a green sub-pixel unit or a blue sub-pixel unit.

Another embodiment of the present invention provides an electronic device, which comprises the aforementioned display screen.

Yet another embodiment of the present invention provides display screen, which comprises: a thin film transistor (TFT) array substrate, a color filter (CF) substrate disposed opposite to the TFT array substrate, and a liquid crystal (LC) layer sandwiched between the TFT array substrate and the CF substrate; the TFT array substrate comprising: a pixel electrode layer and a plurality of fingerprint recognition signal lines, an interlayer insulation layer being disposed between the pixel electrode layer and the plurality of fingerprint recognition signal lines; the CF substrate comprising a black matrix (BM) layer;

the display screen comprising: an active area, and the active area comprising a plurality of pixel units, with each pixel unit comprising a plurality of sub-pixel units; one or more fingerprint recognition blocks being disposed in the active area;

in the fingerprint recognition area: the pixel electrode layer corresponding to each sub-pixel unit comprising a sub-pixel electrode and a fingerprint recognition electrode spaced from the sub-pixel electrode; the BM layer corresponding to each sub-pixel unit comprising a black frame covering the peripheral of the sub-pixel electrode and a black block covering the fingerprint recognition electrode; the fingerprint recognition signal line contacting the fingerprint recognition electrode to electrically connect the fingerprint recognition electrode to an integrated chip of display and fingerprinting recognition;

wherein the fingerprint signal line passing a through hole penetrating the interlayer insulation layer to contact the fingerprint recognition electrode to electrically connect the fingerprint recognition electrode to an integrated chip of display and fingerprinting recognition;

wherein the fingerprint recognition signal line being made of a metal material.

The present invention provides the following advantages. The present invention provides a display screen and an electronic device, by disposing a plurality of one or more fingerprint recognition blocks in the active area, with the corresponding pixel electrode layer comprising a sub-pixel electrode and a fingerprint recognition electrode spaced from the sub-pixel electrode, the corresponding BM layer comprising a black frame covering the sub-pixel electrode peripheral and a black block covering the fingerprint recognition electrode; and disposing the fingerprint recognition signal lines contacting the fingerprint recognition electrode to electrically connect the fingerprint recognition electrode to an integrated chip of display and fingerprinting recognition. The invention is capable of integrating a fingerprint recognition function in a display area having a low resolution and without a touch function, enabling full-screen multi-block fingerprint recognition without time-division scanning, improving fingerprint recognition precision and widening diversity of fingerprint recognition applications, and improving the cost-performance value of traditional display products as well as enhancing the user's experience.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
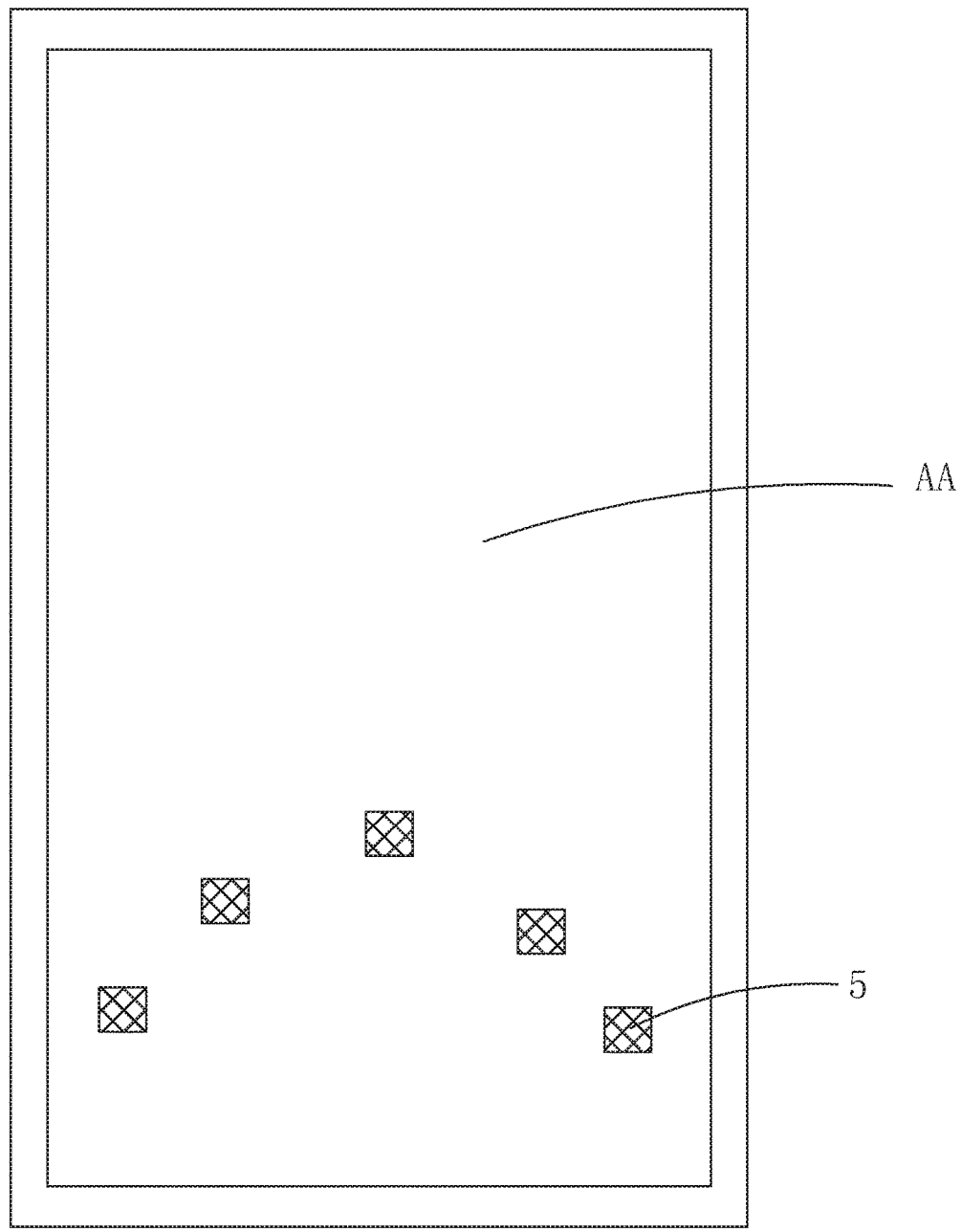
FIG. 1 is a schematic view showing the distribution of the fingerprint recognition blocks in the display screen provided by an embodiment of the present invention.
Figure 2:
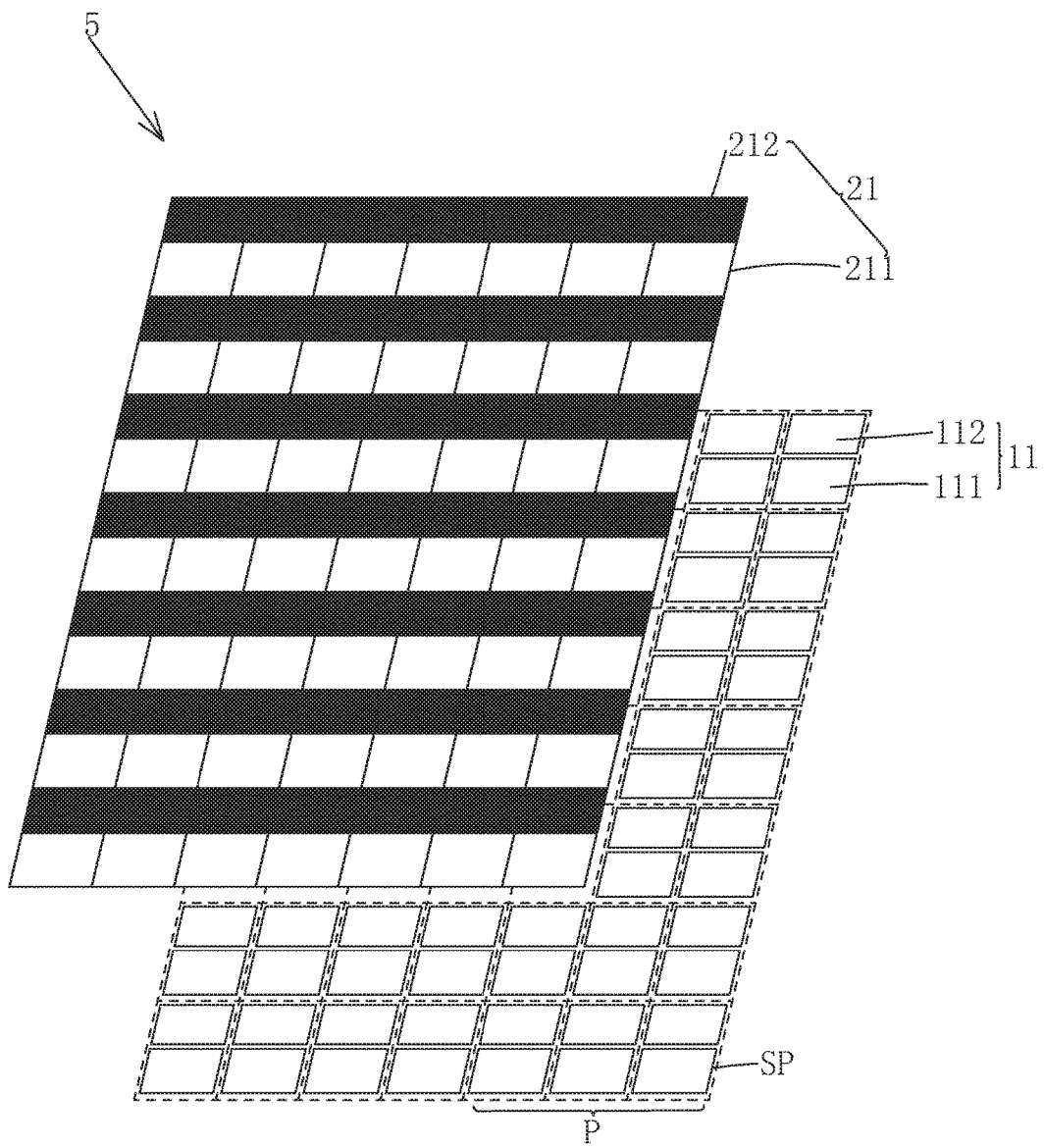
FIG. 2 is a schematic view showing the pixel electrode layer and the BM layer in a fingerprint recognition block of the display screen provided by an embodiment of the present invention.
Figure 3:
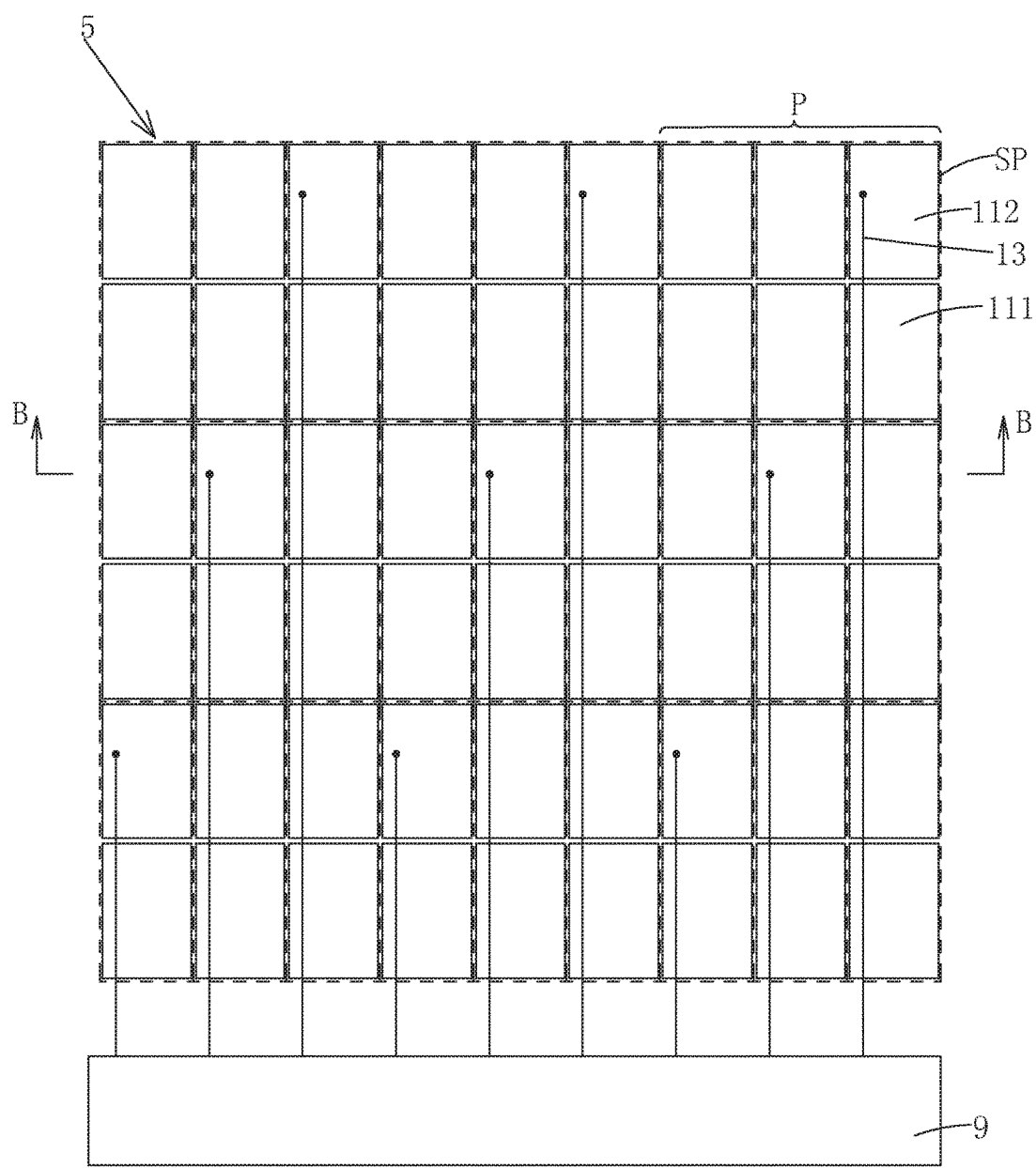
FIG. 3 is a planar view showing the pixel electrode layer and the fingerprint recognition signal line in a fingerprint recognition block of the display screen provided by an embodiment of the present invention.
Figure 4:
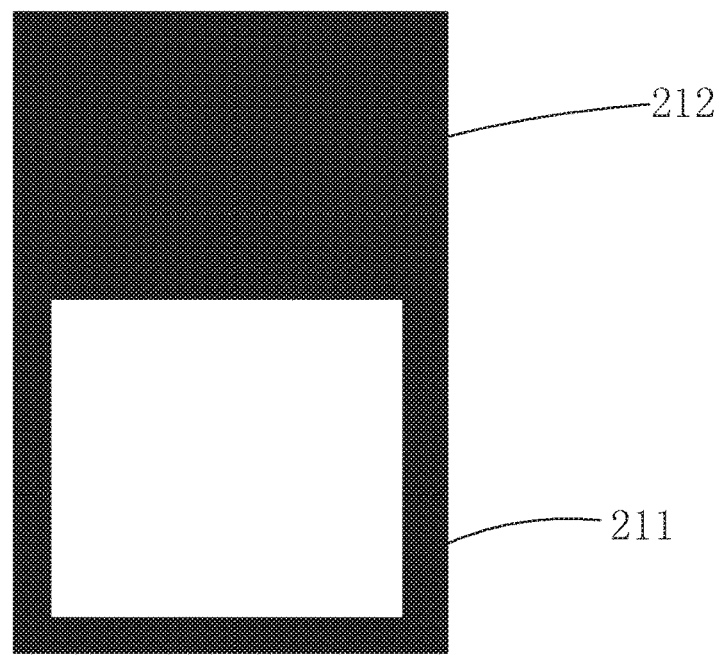
FIG. 4 is a planar view showing the pixel electrode layer and BM layer corresponding to a sub-pixel unit in a fingerprint recognition block of the display screen provided by an embodiment of the present invention.
Figure 4:
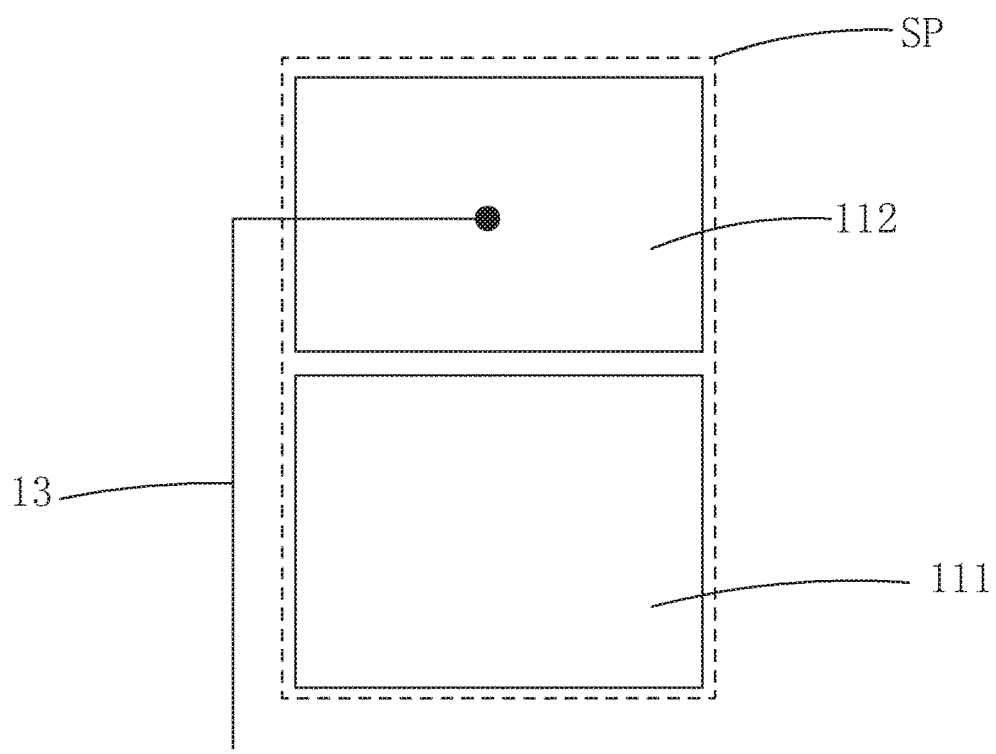
Figure 6:
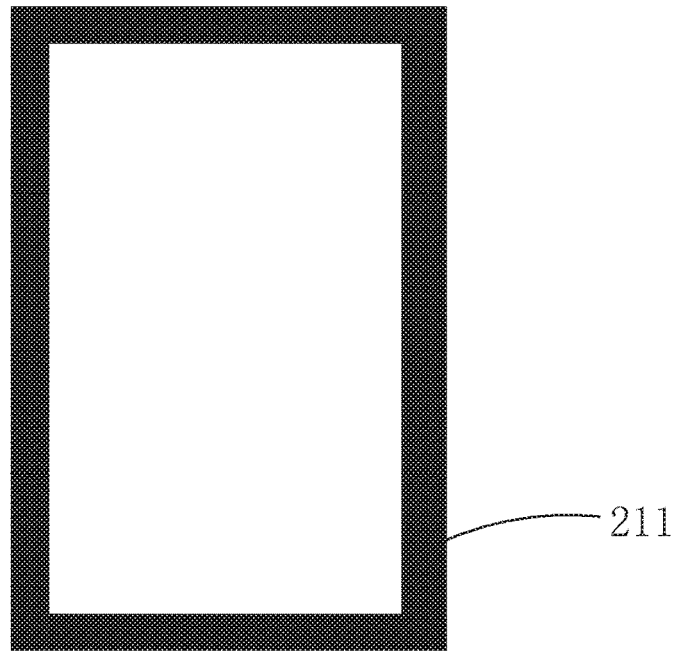
FIG. 6 is a planar view showing the pixel electrode layer and BM layer corresponding to a sub-pixel unit in outside of fingerprint recognition block of the display screen provided by an embodiment of the present invention.
Figure 6:
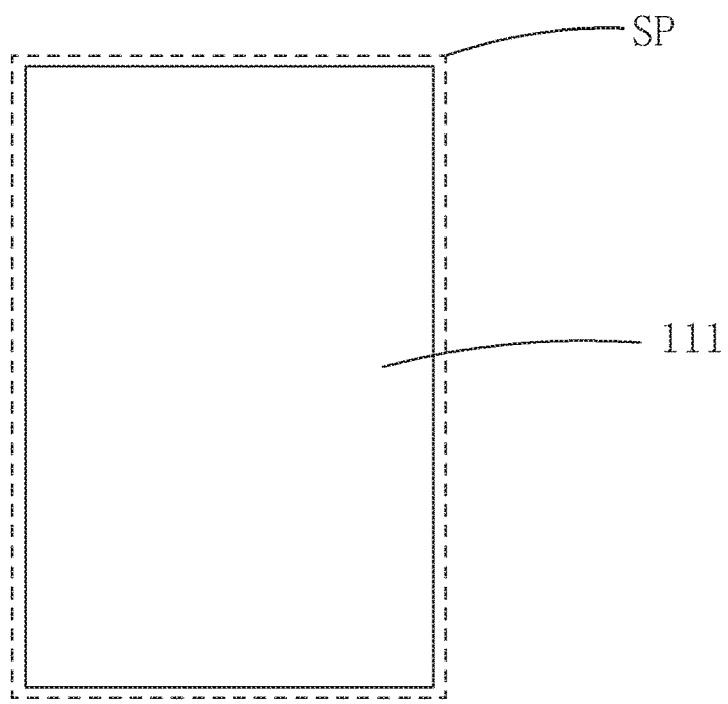

Referring to FIG. 1 or FIG. 6, the present invention provides a display screen.

Figure 5:
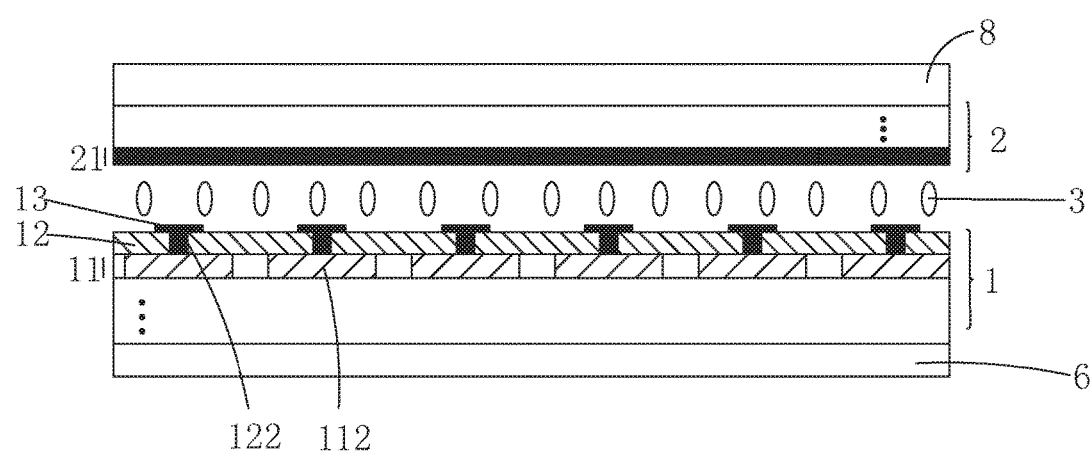
FIG. 5 is a cross-sectional view showing the display screen of FIG. 3 along the B-B direction provided by an embodiment of the present invention.

As shown in FIG. 5, the display screen comprises: a thin film transistor (TFT) array substrate 1, a color filter (CF) substrate 2 disposed opposite to the TFT array substrate 1, and a liquid crystal (LC) layer 3 sandwiched between the TFT array substrate 1 and the CF substrate 2. Moreover, the display screen further comprises a backlight module 6 disposed below the TFT array substrate 1 and an encapsulation cover plate 8 disposed above the CF substrate 2.

Refer to FIGS. 1-4. The display screen comprises an active area AA, and the active area AA further comprises a plurality of pixel units P, with each pixel unit P comprising a plurality of sub-pixel units SP. The active area AA is disposed with one or more fingerprint recognition blocks 5.

The TFT array substrate 1 comprises: a pixel electrode layer 11 and a plurality of fingerprint recognition signal lines 13. An interlayer insulation layer 12 is disposed between the pixel electrode layer 11 and the plurality of fingerprint recognition signal lines 13. Moreover, a base layer, gate layer, active layer source/drain layer and a plurality of insulation layers are disposed below the pixel electrode layer 11, which is the known technology, and the details is not described here.

The CF substrate comprises a black matrix (BM) layer; and further comprises a base layer and a color film layer having red, green and blue color-resist, which is the known technology, and the details is not described here.

In the known display screen with fingerprint recognition design, the pixel electrode layer corresponding to each sub-pixel unit is a whole sub-pixel electrode, and the BM is only a black frame covering the peripheral of the sub-pixel electrode. However, in the present invention, in the fingerprint recognition area 5: the pixel electrode layer 11 corresponding to each sub-pixel unit 11 comprises a sub-pixel electrode 111 and a fingerprint recognition electrode 112 spaced from the sub-pixel electrode 111; the BM layer 21 corresponding to each sub-pixel unit 11 comprises a black frame 211 covering the peripheral of the sub-pixel electrode 111 and a black block 212 covering the fingerprint recognition electrode 112; the fingerprint recognition signal line 13 contacts the fingerprint recognition electrode 112 to electrically connect the fingerprint recognition electrode 112 to an integrated chip 9 of display and fingerprinting recognition. Outside of the fingerprint recognition block 5: the pixel electrode layer 11 corresponding to each sub-pixel unit SP comprises only a sub-pixel electrode 111; and the BM layer 21 corresponding to each sub-pixel unit SP comprises only the black frame 211 covering the sub-pixel electrode 111 peripheral.

The sub-pixel electrode 111 in the fingerprint recognition block 5 is for displaying, and the fingerprint recognition electrode 112 is used for fingerprint recognition. The fingerprint recognition signal line 13 is connected to the fingerprint recognition electrode 112 and the integrated chip 9 of display and fingerprinting recognition to achieve integrating the fingerprint recognition function to the active area AA of the display screen. As such, the design of separating the sub-pixel electrode 111 and the fingerprint recognition electrode 112 avoids the interference between the display signal and the fingerprint recognition signal without using time-division scanning, and does not exclude each other to occupy the time resources of the scanning. Instead, the independent scanning between fingerprint recognition and display improves the fingerprint recognition scanning frequency and efficiency, and enables the display screen without high resolution and touch function to provide fingerprint recognition function.

Specifically, the pixel electrode layer is made of indium tin oxide (ITO). The separation ratio of the sub-pixel electrode 111 and the fingerprint recognition electrode 112 in the fingerprint recognition 5 must make the sub-pixel electrode 111 area as large as possible, on the basis of satisfying the detection requirement of fingerprint recognition, to reduce the loss of pixel aperture rate.

Preferably, the fingerprint recognition signal line 13 is made of a metal material. A deposition and patternizing process is required for forming the fingerprint recognition signal lines 13. Also, through holes 122 must be formed on the interlayer insulation layer 12 corresponding to the fingerprint recognition electrode 112. The fingerprint recognition signal line 13 passes through the through hole 122 on the interlayer insulating layer 12 to electrically connected to the integrated chip 9 of display and fingerprint recognition.

The specific number of the fingerprint recognition blocks 5 is based on satisfying the user experience. For example, disposing five or ten fingerprint recognition blocks can achieve to recognize the fingerprints of all the fingers of one hand or both hands. Also the number of fingers to be checked simultaneously also increases as well as higher fingerprint recognition precision and higher privacy security. The size of each fingerprint recognition block 5 is generally designed to be similar to the area of a finger touching the display screen, with a rectangular shape, and the side length of about 4 mm to 5.5 mm.

Each fingerprint recognition block 5 can correspond to a plurality of pixel units P, and the pixel unit P comprises, but not limited to, a red sub-pixel, a green sub-pixel and a blue sub-pixel. In other words, each sub-pixel unit SP can be a red sub-pixel, a green sub-pixel or a blue sub-pixel. The number of fingerprint electrodes 112 in the fingerprint recognition block 5 required to be connected to the fingerprint recognition signal line can be decided according to the size of the sub-pixel unit SP and the routing difficulty.

The integrated chip 9 of display and fingerprint recognition covers both the displaying and fingerprint recognition driving function, and is able to save routing space of the display screen and reduce design complexity.

The operation theory of the fingerprint recognition by the display screen of the present invention is as follows: the plurality of fingerprint recognition electrodes in the TFT array substrate 1 and the ridges and the valleys of the fingerprint form capacitors, and the capacitance difference between neighboring capacitors is used to form grayscale fingerprint images recognizable by the fingerprint algorithm, so as to detect the local feature points of the fingerprint to achieve fingerprint recognition.

Based on the same theory, the present invention also provides an electronic device, which comprises the aforementioned display screen, capable of integrating a fingerprint recognition function in a display area having a low resolution and without a touch function, enabling full-screen multi-block fingerprint recognition without time-division scanning, improving fingerprint recognition precision and widening diversity of fingerprint recognition applications, and improving the cost-performance value of traditional display products as well as enhancing the user's experience.

In summary, the present invention provides a display screen and an electronic device, by disposing a plurality of one or more fingerprint recognition blocks in the active area, with the corresponding pixel electrode layer comprising a sub-pixel electrode and a fingerprint recognition electrode spaced from the sub-pixel electrode, the corresponding BM layer comprising a black frame covering the sub-pixel electrode peripheral and a black block covering the fingerprint recognition electrode; and disposing the fingerprint recognition signal lines contacting the fingerprint recognition electrode to electrically connect the fingerprint recognition electrode to an integrated chip of display and fingerprinting recognition. The invention is capable of integrating a fingerprint recognition function in a display area having a low resolution and without a touch function, enabling full-screen multi-block fingerprint recognition without time-division scanning, improving fingerprint recognition precision and widening diversity of fingerprint recognition applications, and improving the cost-performance value of traditional display products as well as enhancing the user's experience.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display screen, comprising: a thin film transistor (TFT) array substrate, a color filter (CF) substrate disposed opposite to the TFT array substrate, and a liquid crystal (LC) layer sandwiched between the TFT array substrate and the CF substrate; the TFT array substrate comprising: a pixel electrode layer and a plurality of fingerprint recognition signal lines, an interlayer insulation layer being disposed between the pixel electrode layer and the plurality of fingerprint recognition signal lines; the CF substrate comprising a black matrix (BM) layer;
   the display screen comprising: an active area, and the active area comprising a plurality of pixel units, with each pixel unit comprising a plurality of sub-pixel units; one or more fingerprint recognition blocks being disposed in the active area;
   wherein in a fingerprint recognition area formed of the one or more fingerprint recognition blocks, the pixel electrode layer corresponding to each sub-pixel unit comprises a sub-pixel electrode and a fingerprint recognition electrode spaced from the sub-pixel electrode, the BM layer corresponding to each sub-pixel unit comprising a black frame covering a periphery of the sub-pixel electrode and a black block covering the fingerprint recognition electrode, the fingerprint recognition signal line contacting the fingerprint recognition electrode to electrically connect the fingerprint recognition electrode to an integrated chip of display and fingerprinting recognition;
   wherein in a region of the active area that is other than the fingerprint recognition area and surrounds the fingerprint recognition area, the pixel electrode layer corresponding to each sub-pixel unit comprises only a sub-pixel electrode, such that the active area comprises both the fingerprint recognition area and the region that is other than and surrounds the fingerprint recognition area, wherein at least some of the sub-pixel units of the active area comprise only the sub-pixel electrodes;
   wherein the sub-pixel electrodes and the fingerprint recognition electrodes are arranged in one and a same layer that forms the pixel electrode layer and the sub-pixel electrodes and the fingerprint recognition electrodes are arranged alternate with each other in the one or more fingerprint recognition blocks of the active area.

2. The display screen as claimed in claim 1, wherein the fingerprint signal line passes a through hole penetrating the interlayer insulation layer to contact the fingerprint recognition electrode to electrically connect the fingerprint recognition electrode to an integrated chip of display and fingerprinting recognition.

3. The display screen as claimed in claim 1, wherein the fingerprint recognition signal line is made of a metal material.

4. The display screen as claimed in claim 1, wherein the pixel electrode layer is made of indium tin oxide (ITO).

5. The display screen as claimed in claim 1, wherein the fingerprint recognition block has a rectangular shape, with the edge length of 4 mm-5.5 mm.

6. The display screen as claimed in claim 1, wherein outside of the fingerprint recognition block: the pixel electrode layer corresponding to each sub-pixel unit comprises a sub-pixel electrode; and the BM layer corresponding to each sub-pixel unit comprises only the black frame covering the sub-pixel electrode peripheral.

7. The display screen as claimed in claim 1, wherein the sub-pixel unit is a red sub-pixel unit, a green sub-pixel unit or a blue sub-pixel unit.

8. An electronic device, comprising a display screen as claimed in claim 1.

9. A display screen, comprising: a thin film transistor (TFT) array substrate, a color filter (CF) substrate disposed opposite to the TFT array substrate, and a liquid crystal (LC) layer sandwiched between the TFT array substrate and the CF substrate; the TFT array substrate comprising: a pixel electrode layer and a plurality of fingerprint recognition signal lines, an interlayer insulation layer being disposed between the pixel electrode layer and the plurality of fingerprint recognition signal lines; the CF substrate comprising a black matrix (BM) layer;
   the display screen comprising: an active area, and the active area comprising a plurality of pixel units, with each pixel unit comprising a plurality of sub-pixel units; one or more fingerprint recognition blocks being disposed in the active area;
   wherein in a fingerprint recognition area formed of the one or more fingerprint recognition blocks, the pixel electrode layer corresponding to each sub-pixel unit comprises a sub-pixel electrode and a fingerprint recognition electrode spaced from the sub-pixel electrode, the BM layer corresponding to each sub-pixel unit comprising a black frame covering a periphery of the sub-pixel electrode and a black block covering the fingerprint recognition electrode, the fingerprint recognition signal line contacting the fingerprint recognition electrode to electrically connect the fingerprint recognition electrode to an integrated chip of display and fingerprinting recognition;
   wherein in a region of the active area that is other than the fingerprint recognition area and surrounds the fingerprint recognition area, the pixel electrode layer corresponding to each sub-pixel unit comprises only a sub-pixel electrode, such that the active area comprises both the fingerprint recognition area and the region that is other than and surrounds the fingerprint recognition area, wherein at least some of the sub-pixel units of the active area comprise only the sub-pixel electrodes;
   wherein the sub-pixel electrodes and the fingerprint recognition electrodes are arranged in one and a same layer that forms the pixel electrode layer and the sub-pixel electrodes and the fingerprint recognition electrodes are arranged alternate with each other in the one or more fingerprint recognition blocks of the active area;
   wherein the fingerprint signal line passing a through hole penetrating the interlayer insulation layer to contact the fingerprint recognition electrode to electrically connect the fingerprint recognition electrode to an integrated chip of display and fingerprinting recognition;
   wherein the fingerprint recognition signal line being made of a metal material.

10. The display screen as claimed in claim 9, wherein the pixel electrode layer is made of indium tin oxide (ITO).

11. The display screen as claimed in claim 9, wherein the fingerprint recognition block has a rectangular shape, with the edge length of 4 mm-5.5 mm.

12. The display screen as claimed in claim 9, wherein outside of the fingerprint recognition block: the pixel electrode layer corresponding to each sub-pixel unit comprises a sub-pixel electrode; and the BM layer corresponding to each sub-pixel unit comprises only the black frame covering the sub-pixel electrode peripheral.

13. The display screen as claimed in claim 9, wherein the sub-pixel unit is a red sub-pixel unit, a green sub-pixel unit or a blue sub-pixel unit.

* * * * *